United States Patent
Chung et al.

[11] Patent Number: 6,150,730
[45] Date of Patent: Nov. 21, 2000

[54] CHIP-SCALE SEMICONDUCTOR PACKAGE

[75] Inventors: Chih-Ming Chung; Kuo-Pin Yang, both of Kaohsiung Hsien; Jen-Kuang Fang, Ping-Tung Hsien; Su Tao, Kaohsiung, all of Taiwan

[73] Assignee: Advanced Semiconductor Engineering, Inc., Kaohsiung Hsien, Taiwan

[21] Appl. No.: 09/349,231

[22] Filed: Jul. 8, 1999

[51] Int. Cl.[7] ............................ H01L 23/48; H01L 23/52; H01L 29/40

[52] U.S. Cl. .......................... 257/786; 252/783; 252/787; 438/118

[58] Field of Search ................................ 257/786, 783, 257/787; 438/118

[56] References Cited

U.S. PATENT DOCUMENTS

| | | | |
|---|---|---|---|
| 5,849,608 | 12/1998 | Abe | 438/123 |
| 5,884,396 | 3/1999 | Lin | 29/827 |
| 5,925,934 | 7/1999 | Lim | 257/778 |
| 5,977,624 | 11/1999 | Heo et al. | 257/701 |
| 5,990,563 | 11/1999 | Kim | 257/778 |
| 5,999,413 | 12/1999 | Ohuchi et al. | 361/772 |
| 6,011,315 | 1/2000 | Toyosawa et al. | 257/783 |
| 6,013,946 | 1/2000 | Lee et al. | 257/684 |
| 6,054,773 | 4/2000 | Ohsawa et al. | 257/783 |

*Primary Examiner*—Mahshid Saadat
*Assistant Examiner*—Jhihan B. Clark
*Attorney, Agent, or Firm*—Bacon & Thomas, PLLC

[57] ABSTRACT

A chip-scale semiconductor package mainly includes a semiconductor chip, a substrate and a package body. Said chip is attached onto said substrate by an adhesive layer. Said chip has a plurality of bonding pads formed thereon. Said adhesive layer has an aperture corresponding to the bonding pads of said chip such that the bonding pads can be exposed within an aperture. Said substrate has several through-holes respectively corresponding to the bonding pads of said chip and parts of the area around the edge of said chip for dispensing of encapsulant after the soldering of leads of said substrate to the bonding pads of said chip. The encapsulant dispensed into the through-holes can flow from the surface of said chip to the edge thereof. Said package body has one portion provided within the through-hole of said substrate and another portion provided around the edge of said chip whereby encapsulation process is accomplished without having to turn the whole semiconductor package device.

6 Claims, 4 Drawing Sheets

CHIP-SCALE SEMICONDUCTOR PACKAGE

BACKGROUND OF THE INVENTION

1. Field of the Invention

The present invention generally relates to a semiconductor device, and more specifically, to a chip scale semiconductor package having a ball grid array (BGA) provided with through-holes for dispensing liquid encapsulant.

2. Description of the Related Art

Ball grid array-(hereinafter "BGA") type semiconductor package is typically designed to provide high signal inputs and outputs (I/O). A BGA-type package is suitable for the packaging of ultra-large-scale integration (ULSI) integrated circuits made in submicron scale. A BGA-type package is the preferred choice for packaging of high I/Os chips.

A BGA-type package is typically constructed with a BGA substrate with a chip attached thereon. Leads of said BGA substrate are soldered to bonding pads of said chip. In the encapsulation process, an encapsulant is dispensed onto the bonding area of said BGA substrate and then the encapsulant is cured by heating. Then, said BGA substrate is turned so that the chip mounting surface faces up, and encapsulant is dispensed onto the area around the edge of said chip said encapsulant is cured by heating. However, dispensing and curing have to be repeated twices. Thus, the whole encapsulation process is time-consuming thereby decreasing the throughput rate.

FIG. 1 illustrates the die-attaching process of a conventional BGA-type package. As shown in FIG. 1, a substrate 110 is attached onto a semiconductor die 100 by an adhesive layer 102 in such a manner that bonding pads 101 of said die 100 are exposed within a through-hole 103 of said substrate 110, which defines a first encapsulation area 114. Said substrate 110 comprises a copper foil layer 111 and a polymer layer 113. The copper foil layer 111 is provided with a plurality of leads 112 located within the first encapsulation area 114 for soldering to the bonding pads 101 of said die 100. The polymer layer 113 is further provided with a plurality of holes (not shown) for mounting solder balls in such a manner that said solder balls are connected to said copper foil layer 111 whereby said solder balls are electrically interconnected to said chip through the leads 112 of said substrate 110. The area around the edge of said die 100 is defined by a second encapsulation area 104.

FIG. 2 illustrates the lead bonding process of said conventional BGA type package. As shown in FIG. 2, the leads 112 of said substrate 110 are soldered to the bonding pads 101 of said die 100 thereby interconnecting said die 100 and said substrate 110.

FIG. 3 illustrates the first encapsulation process of said conventional BGA type package. As shown in FIG. 3, encapsulant is dispensed onto the first encapsulation area 114 by a dispenser A and then cured into a first package body 115 which encapsulates the leads 112 of said substrate 110 and the bonding pads 101 of said die 100. Said substrate 110 cannott be turned to perform the second encapsulation process until the encapsulant is cured.

FIG. 4 illustrates the second encapsulation process of said conventional BGA type package. As shown in FIG. 4, encapsulant is dispensed onto the second encapsulation area 104 by a dispenser A and then cured into a second package body 105 which encapsulates the area around the edge of said die 100. However, dispensing and curing have to be repeated twice. Therefore, the whole encapsulation process is time-consuming and thereby decreases the throughput rate.

Accordingly, the present invention is intended to mitigate and/or obviate the above problems by providing a substrate having at least a through-hole through which encapsulant can flow from the active surface of the die to the edge thereof. Therefore, the encapsulation process can be accomplished without turning the substrate thereby reducing the manufacturing time and increasing the throughput rate.

SUMMARY OF THE INVENTION

It is a primary objective of the present invention to provide a chip-scale semiconductor package that includes a substrate with a plurality of through-holes through which encapsulant can be dispensed on two surface at the same time thereby reducing the manufacturing time and increasing the throughput rate.

The chip-scale semiconductor package, in accordance with the present invention, mainly includes a chip, a substrate and a package body. Said chip is attached onto said substrate by an adhesive layer. Said chip has bonding pads formed thereon. Said adhesive layer has an aperture corresponding to the bonding pads of said semiconductor chip such that the bonding pads are exposed within the aperture. Said substrate has a first through-hole and second through-holes which respectively correspond to the bonding pads of said chip and parts of the area around the edge of said chip. Said substrate is provided with a plurality of leads soldered to the bonding pads of said chip. A package body has one portion within the first hole of said substrate and another portion around the edge of said chip. Said package body is formed by dispensing encapsulant through the first through-hole and the second through-holes whereby the encapsulant can flow from the active surface of the die to the edge thereof. Therefore, the encapsulation process can be accomplished without turning the whole semiconductor package device. Said substrate is provided with a plurality of holes for mounting solder balls for electrical connection to an outside circuit.

Other objectives, advantages and novel features of the invention will become more apparent from the following detailed description when taken in conjunction with the accompanying drawings.

DETAILED DESCRIPTION OF THE PREFERRED EMBODIMENT

The chip-scale semiconductor package, in accordance with the present invention mainly comprises a substrate having through-holes defined therein. The through-holes have a bar-like contour such that the through-holes can provide communication channel between the surface of said chip and the edge thereof when said substrate is attached onto said chip. Therefore, in the encapsulation process, turning of said substrate is not required after the encapsulant is dispensed and cured on one surface of said semiconductor package and before the encapsulant is dispensed and cured on the other surface of said semiconductor package. The contour of the through-holes, as disclosed in the preferred embodiment of the present invention, is configured as L-shape and Z-shape; wherein the through-hole of the L-shape is suitable for placement on the corner of said chip for liquid encapsulant to flow through; and the through-hole of the Z-shape is suitable for traversing from one side of said chip to the other for liquid encapsulant to flow through. When the liquid encapsulant is dispensed into the through-holes, the liquid encapsulant will flow from the area around the through-holes onto the edge of said chip covered by said substrate, thereby forming a package body around the edge of said chip.

Figure 1:
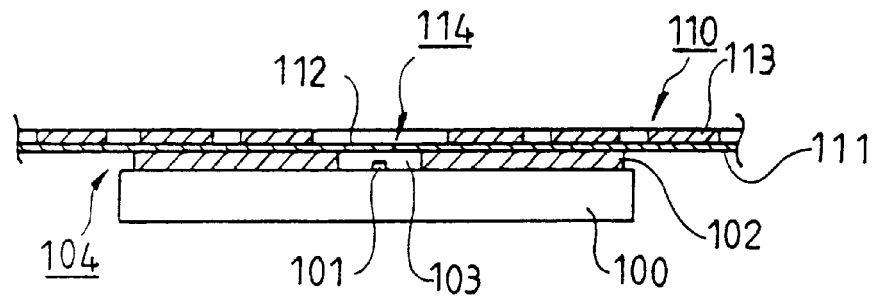
FIG. 1 is a cross-sectional view of the die attaching process of a conventional BGA type package.
Figure 2:
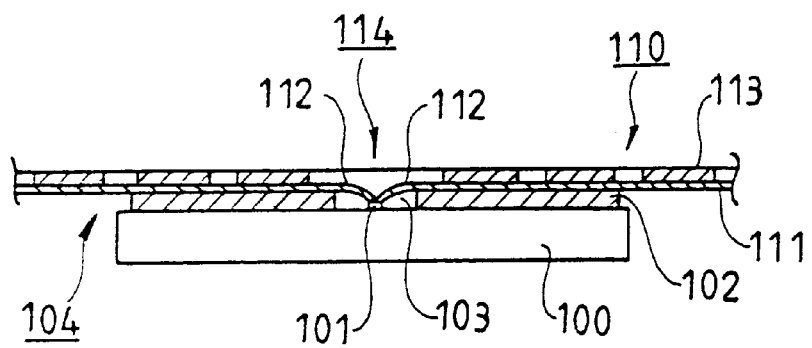
FIG. 2 is the lead-bonding process of said conventional BGA type package.
Figure 3:
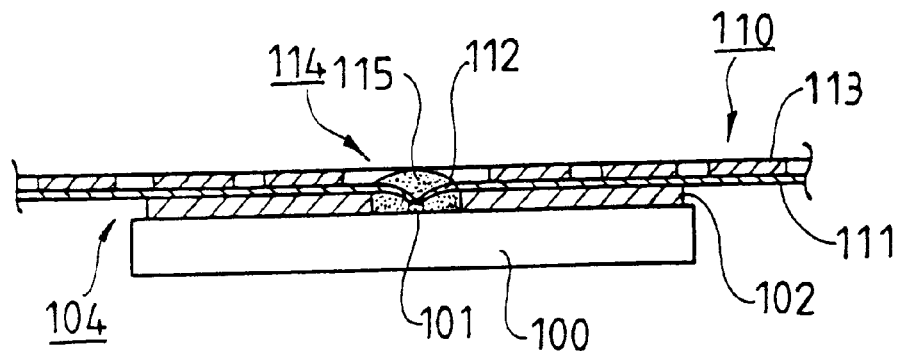
FIG. 3 is a cross-sectional view of the first encapsulation process of said conventional BGA-type package.
Figure 4:
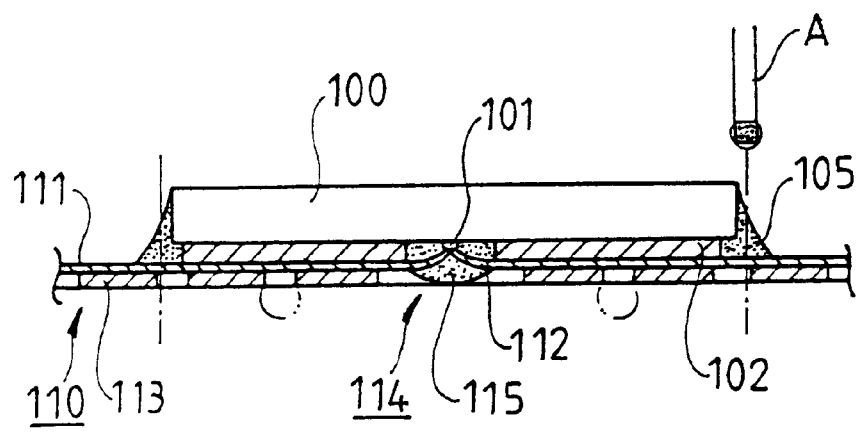
FIG. 4 is said conventional BGA-type package.
Figure 5:
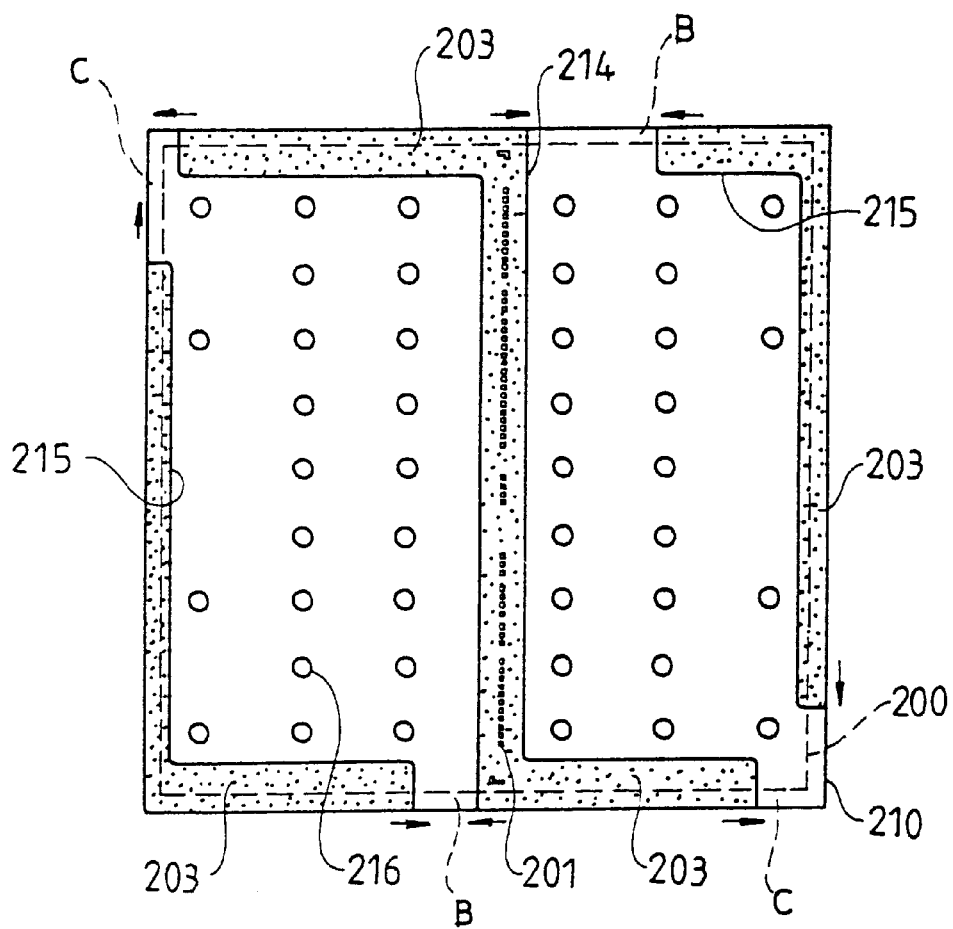
FIG. 5 is the top view of a chip-scale semiconductor package in accordance with the present invention.
Figure 6:
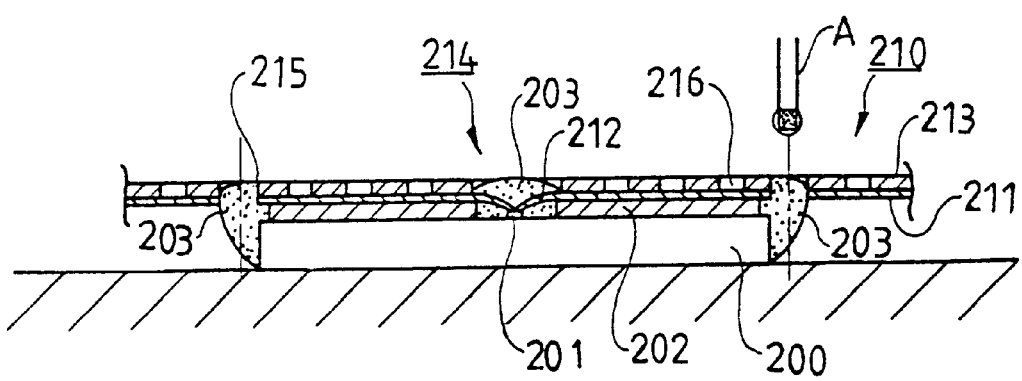
FIG. 6 is a cross-sectional view of the encapsulation process of the chip scale semiconductor package in accordance with the present invention.
Figure 7:
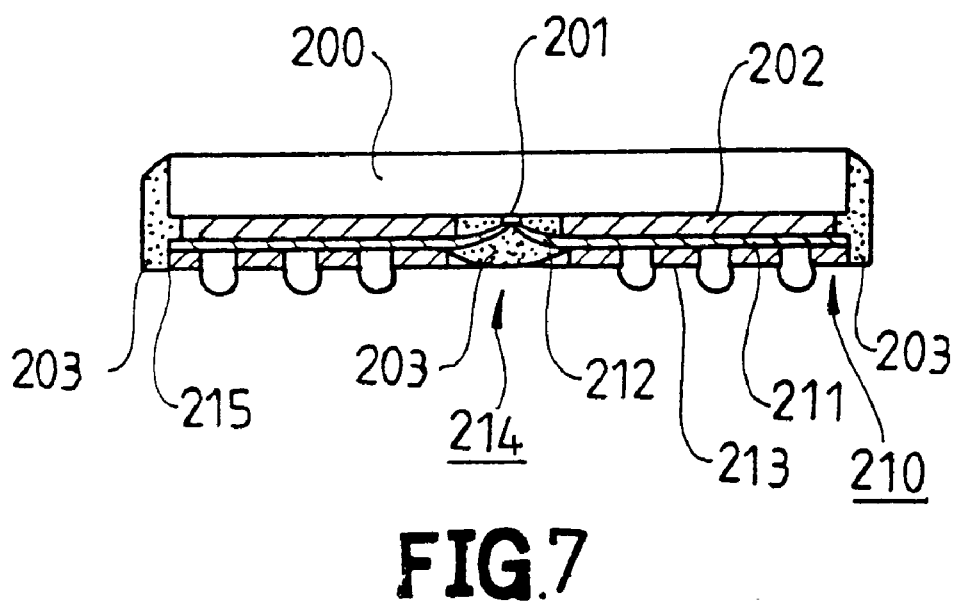
FIG. 7 is a cross-sectional view of the chip scale semiconductor package in accordance with the present invention.

FIG. 5, FIG. 6 and FIG. 7 illustrate a chip scale semiconductor package which, in accordance with the present invention, mainly includes a semiconductor chip 200 and a substrate 210. Said chip 200 has bonding pads 201 formed thereon. Said substrate 210 comprises a copper foil layer 211 and a polymer layer 213. Said substrate 210 has a first through-hole 214 and two second through-holes 215 wherein the first through-hole 214 is disposed between two second through-holes 215. The through-hole 214 is positioned with a plurality of leads connected to the bonding pads 201 of said chip 200. The polymer layer 213 of said substrate 210 is provided with a plurality of holes 216 for mounting solder balls (not shown) in such a manner that said solder balls are connected to the copper foil layer, whereby said solder balls are electrically interconnected to said chip 200 through the leads 212. Said chip 200 is attached onto said substrate 210 through an adhesive layer 202. Said adhesive layer 202 has a plurality of apertures (not shown) defined therein and corresponding to the first through-hole 214 and second through-holes 215 of said substrate 210. The first through-hole 214 has a Z-shaped contour and traverses from one side of said chip 200 to the other. Therefore, the liquid encapsulant dispensed into the first through-hole 214 not only fills the first through-hole 214 and covers the leads 212 and bonding pads 201 to form a package body 203 but also flows to the edge of said chip 200 to form a package body 203 encapsulating the edge of said chip 200. The second through-holes 215 of said substrate 210 have an L-shaped contour and are located on one of the corners of said chip 200. Therefore, the liquid encapsulant dispensed into the second through-holes 215 not only fills the second through-holes 215 to form a package body 203 but also flows to the corner of said chip 200 to form a package body 203 encapsulating the corner of said chip 200. When liquid encapsulant is dispensed into the first through-hole 214 and the second through-holes 215, the liquid encapsulant will flow into areas B and C (around the corner) of said chip 200 as indicated by the arrows shown in FIG. 5, whereby the package bodies 203P, 203P', 203Q, 203Q' can be combined together to form a package body 203 which encapsulates the through-holes 214, 215 of said substrate 210 and the area around the edge of said chip 200. Therefore, the encapsulation of both the through-holes 214, 215 of said substrate 210 and the area around the edge of said chip 200 can be accomplished without turning the whole semiconductor package device. The encapsulation process of the chip-scale semiconductor package in accordance with the present invention can be performed by using an overhead dispenser A to dispense liquid encapsulant into the second through-holes 215, the first through-hole 214 and the second through-holes 215 of said substrate 210, respectively. Preferably, said chip 200 is a centro-pad-designed chip.

Referring to FIG. 1, FIG. 2, FIG. 3 and FIG. 4, said conventional BGA-type package comprises a package body 105 around the edge of said chip 100 and a package body 115 filling the through-hole of said substrate 110 wherein turning of said substrate 100 is not necessary for the formation of the package body 105 and the package body 115.

Although the invention has been explained in relation to its preferred embodiments, it is to be understood that many other possible modifications and variations can be made without departing from the spirit and scope of the invention as hereinafter claimed.

What is claimed is:

1. A chip scale semiconductor package comprising:
   a semiconductor chip having a plurality of bonding pads formed thereon;
   an adhesive layer having an aperture defined therein, said adhesive layer attached to the surface of said semiconductor chip in such a manner that the aperture corresponds to the bonding pads of said semiconductor chip;
   a substrate having a through-hole defined therein, said substrate attached to said adhesive layer in such a manner that the through-hole traverses from one side of said chip to the other and corresponds to the aperture of said adhesive layer, the through-hole of said substrate is provided with a plurality of leads connected to the bonding pads of said semiconductor chip; and
   a package body having one portion within the through-hole of said substrate and another portions around the edge of said chip,
   wherein said package bodies are formed within the through-hole of said substrate and around the edge of said chip at the same time, and the encapsulation process is accomplished by dispensing encapsulant through the through-hole and without having to turn the whole semiconductor package device.

2. The chip-scale semiconductor package, as claimed in claim 1, wherein said substrate comprises a copper foil layer and a polymer layer, and said polymer layer is provided with a plurality of holes for mounting solder balls in such a manner that said solder balls are connected to the copper foil layer whereby said solder balls are electrically interconnected to said chip through the leads of said substrate.

3. The chip scale-semiconductor package, as claimed in claim 1, wherein said adhesive layer has a plurality of apertures defined therein and said substrate has a plurality of through-holes defined therein wherein said substrate is superimposed on said adhesive layer in such a manner that the through-holes of said substrate correspond to the apertures of said adhesive layer.

4. The chip scale-semiconductor package, as claimed in claim 3, wherein one of the apertures of said adhesive layer and one of the through-holes of said substrate have a Z-shaped contour.

5. The chip-scale semiconductor package, as claimed in claim 3, wherein one of the apertures of said adhesive layer and one of the through-holes of said substrate have a L-shaped contour and are located on one of the corners of said chip.

6. The chip-scale semiconductor package, as claimed in claim 1, wherein said chip is a centro-pad-designed chip.

* * * * *